(12) United States Patent
Lachapelle

(10) Patent No.: US 9,532,487 B1
(45) Date of Patent: Dec. 27, 2016

(54) COMPUTER ROOM AIR FILTRATION AND COOLING UNIT

(71) Applicant: Amazon Technologies, Inc., Seattle, WA (US)

(72) Inventor: Alan Joseph Lachapelle, Reston, VA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/742,562

(22) Filed: Jun. 17, 2015

(51) Int. Cl.
*H05K 7/20* (2006.01)
*H01L 23/473* (2006.01)

(52) U.S. Cl.
CPC .................. *H05K 7/20736* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 2004/0012983 A1* | 1/2004 | Fearing | H02M 7/003 363/16 |
| 2007/0151707 A1* | 7/2007 | Lyons | H05K 7/20145 165/104.21 |
| 2007/0227709 A1* | 10/2007 | Upadhya | G06F 1/20 165/121 |
| 2007/0263354 A1* | 11/2007 | Crocker | F04D 29/588 361/699 |
| 2008/0017355 A1* | 1/2008 | Attlesey | G06F 1/181 165/104.33 |
| 2008/0158815 A1* | 7/2008 | Campbell | H05K 7/20754 361/696 |
| 2008/0272484 A1* | 11/2008 | Myers | H01L 23/473 257/714 |
| 2008/0272485 A1* | 11/2008 | Myers | H01L 23/473 257/714 |
| 2008/0283218 A1* | 11/2008 | Gwin | F28D 15/00 165/80.4 |
| 2009/0080173 A1* | 3/2009 | Porter | H05K 7/20827 361/831 |
| 2009/0086428 A1* | 4/2009 | Campbell | H05K 7/2079 361/694 |
| 2009/0086432 A1* | 4/2009 | Campbell | H05K 7/20754 361/696 |
| 2010/0243288 A1* | 9/2010 | Eriksson | H01B 17/54 174/15.3 |
| 2010/0290190 A1* | 11/2010 | Chester | H05K 7/20772 361/701 |
| 2011/0185758 A1* | 8/2011 | Shimokawa | H05K 7/202 62/259.2 |

(Continued)

*Primary Examiner* — Anthony Haughton
*Assistant Examiner* — Razmeen Gafur
(74) *Attorney, Agent, or Firm* — Kilpatrick Townsend & Stockton LLP

(57) ABSTRACT

A system for cooling air includes an air cooling apparatus that includes an intermediate ducted section with two movable dampers separated by a divider containing a heat exchange element. The heat exchange element can be situated parallel to a direction of airflow in the air cooling apparatus, such that opening both dampers can cause a flow of air to bypass the apparatus and closing both dampers can force the air to pass through the heat exchange element.

20 Claims, 9 Drawing Sheets

(56) References Cited

U.S. PATENT DOCUMENTS

| | | | |
|---|---|---|---|
| 2011/0226442 A1* | 9/2011 | Tustaniwskyj | G01R 31/2874 165/47 |
| 2011/0226448 A1* | 9/2011 | Valenzuela | F28F 3/12 165/109.1 |
| 2012/0327602 A1* | 12/2012 | Kulkarni | H02M 7/003 361/700 |
| 2014/0078668 A1* | 3/2014 | Goulden | H05K 7/20736 361/679.47 |
| 2014/0198453 A1* | 7/2014 | Zhang | H01L 23/473 361/699 |
| 2014/0211531 A1* | 7/2014 | Yamashita | H02M 7/003 363/141 |
| 2014/0340848 A1* | 11/2014 | Vos | H01L 23/427 361/701 |

* cited by examiner

COMPUTER ROOM AIR FILTRATION AND COOLING UNIT

BACKGROUND

A datacenter typically contains a collection of computer servers and electronic components for the management, operation and connectivity of those servers. Even in isolation, datacenter electronic components may generate sufficient heat that proactive temperature management becomes important to prolong the life of the components and ensure the smooth and continuous operation of the datacenter. Datacenter electronic components are often arranged together. For example, datacenter electronic components can be vertically arranged in racks, within server cabinets, or co-located in server rooms. When heat-generating electronic components are arranged together, however, the cumulative generation of heat can increase the ambient temperature and exacerbate the challenge of managing the temperature of individual components.

BRIEF DESCRIPTION OF THE DRAWINGS

Various embodiments in accordance with the present disclosure will be described with reference to the drawings, in which.

DETAILED DESCRIPTION

Figure 1:
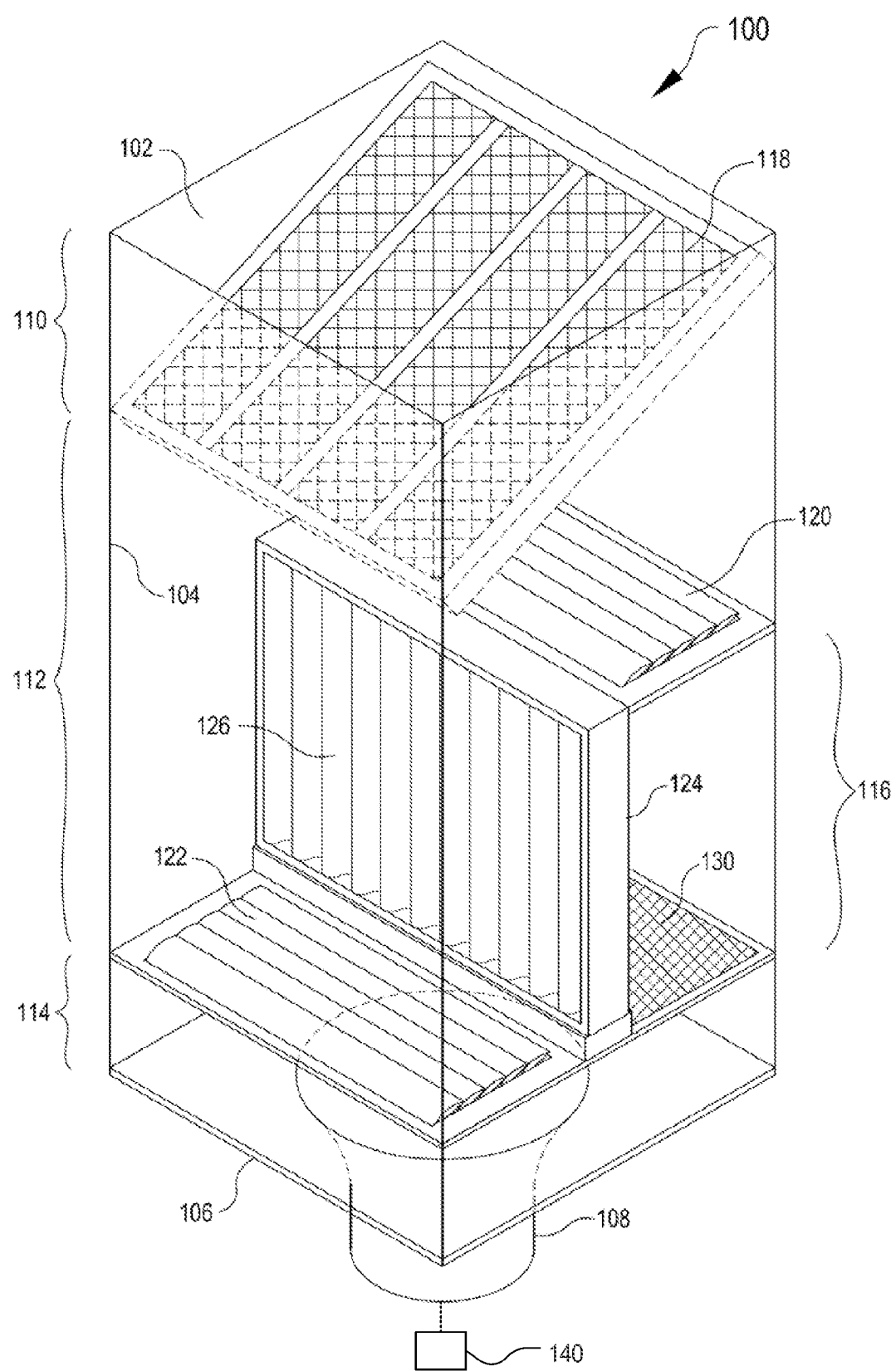
FIG. 1 is an isometric view of a cooling unit for a computer room, in accordance with embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various embodiments herein described relate to cooling units and systems for regulating the temperature and air quality of cooling airflow for components in a datacenter. Conventional air handling units for datacenter electronic component facilities have focused on cooling. Cooling an airflow, however, can require a significant amount of electrical power. Lower-cost cooling can be achieved by using low-temperature outside air, when available, and/or by employing evaporative cooling. Evaporative coolers (which can also be referred to as swamp coolers, desert coolers, and wet-air coolers) pass a flow of air past a reservoir containing an evaporable liquid such as water. A portion of the thermal energy of the flow of air is captured by the water when it evaporates, lowering the cumulative temperature of the air and entrained water vapor. To achieve substantial thermal efficiency, evaporative coolers may cause the flow of air to pass through a tortuous path adjacent to a reservoir of the evaporable liquid, or through a porous substance containing the evaporable liquid. In either case, when low-temperature outside air is available, the energy expended to further condition the already low-temperature outside air via the evaporative cooler may be substantially wasted. Furthermore, entraining a large quantity of water vapor in a cooling airflow can be detrimental to electronic devices that receive the cooling airflow; and high volumes of airflow required to cool components in this manner can also accelerate wear-and-tear on filters in a cooling system.

Embodiments herein described include a cooling unit that receive a flow of air at an input and can selectively control the amount of the airflow that is passed through a heat exchanger so as to be able to avoid wasting energy by needlessly further conditioning already low-temperature outside air. In many embodiments, the cooling unit is configured to selectively divert portions of the flow of air via two (or more) dampers. In many embodiments, a cooling unit is controllable to route the airflow via air flow diversion approaches that can include diverting all of the airflow around a heat exchanger, passing all of the airflow through the heat exchanger, and passing a portion of the airflow through the heat exchanger and diverting a portion of the airflow around the heat exchanger. Any suitable heat exchanger element can be employed (e.g., an air conditioning heat exchanger, a water cooled heat exchanger, and/or an evaporative cooling element).

Some embodiments herein described are also directed to methods and systems for cooling a flow of air by using an apparatus such as the apparatus above to selectively route the flow of air around a heat exchanger, through the heat exchanger, and/or a combination of around and through the heat exchanger so as to regulate the temperature of air at the outlet as well as to limit a pressure drop across the apparatus.

Some additional embodiments herein described are also directed to methods and systems for cooling multiple electronic elements or electronic element enclosures, cabinets, racks, rooms or containers via multiple cooling apparatuses as described above, which can communicate with one another via a network. In some cases, a control unit receives temperature information for the multiple electronic element enclosures and pressure and/or air flow information for an air flow drive unit and processes the received information to control individual cooling apparatuses to direct an air flow according to a detected cooling and/or airflow need, and to control a rate of airflow at the air flow drive unit.

FIG. 1 is a perspective view of an example cooling apparatus 100, in accordance with embodiments. The example cooling apparatus 100 includes an inlet 102 and an inlet section 110, a sidewall 104 enclosing an intermediate section 112, and an end wall 106 enclosing an outlet section 114. The cooling apparatus 100 is configured to receive an air flow at the inlet 102, pass the air flow through the intermediate section 112 and outlet section 114 until the air flow leaves the cooling apparatus via the outlet 108. In some cases, the cooling apparatus inlet 102 includes an opening in the sidewall 104 in the inlet section 110.

The inlet section 110 includes, or is adjacent to, an inlet filter 118 which can be formed of any suitable material for a high throughput filter, including one or more layers of porous fabric or paper membrane materials suitable for a particulate air filter. The inlet filter 118 can be replaceable by, for example, being slidingly disposed within the inlet section 110 from a slot, hatch, or other suitable opening in the cooling apparatus 100. In some cases, the inlet filter 118 can be removed without disassembling the cooling apparatus 100, so that a new replaceable filter can be emplaced. In some cases, the filter can be replaced without deactivating airflow through the cooling apparatus 100.

In alternative embodiments, the inlet filter 118 can also include one or more desiccating materials, so as to remove moisture from the airflow at the inlet filter. In embodiments, the desiccating materials can be removed with the inlet filter 118 when the filter is removed and can be recharged by removing the moisture content. In some cases, inlet filters 118 are disposable.

The intermediate section 112 includes: a lower damper 122 that fluidly connects the intermediate section 112 with the outlet section 114; an upper damper 120 that connects the intermediate section 112 with an elongate chamber 116 also within the intermediate section, and that is fluidly connected with the outlet section 114; and a divider 124 that abuts the elongate chamber 116 between the upper and lower dampers 120, 122 containing a heat exchanger 126 which can also be an evaporative element for an evaporative heat exchanger. The divider 124 can be arranged parallel to a direction of the airflow for which the cooling apparatus 100 is configured. In some cases, the elongate chamber 116 can be fluidly connected with the outlet section 114 via a chamber outlet 130, which can include therein any suitable filter material as described above for either or both of trapping particulates, reducing moisture content of air that passes therethrough, or preventing spatter and which may include a desiccating material. In other cases, the fluid connection between the elongate chamber 116 and the outlet section 114 can be a substantially open channel, a grating, or any other opening with or without a filter.

The upper and lower dampers 120 and 122 can be opened, closed, or partially opened individually, so as to enable the cooling apparatus 100 to cause air to flow through either damper, both dampers, or neither damper. The airflow is consolidated at the outlet section 114 and recombined into a flow through the outlet 108. At a point beyond the outlet 108, a sensor 140 may measure any or all of: humidity, temperature, pressure, flow rate or airspeed, or any other suitable parameter of a volume of air beyond the outlet 108.

Figure 2:
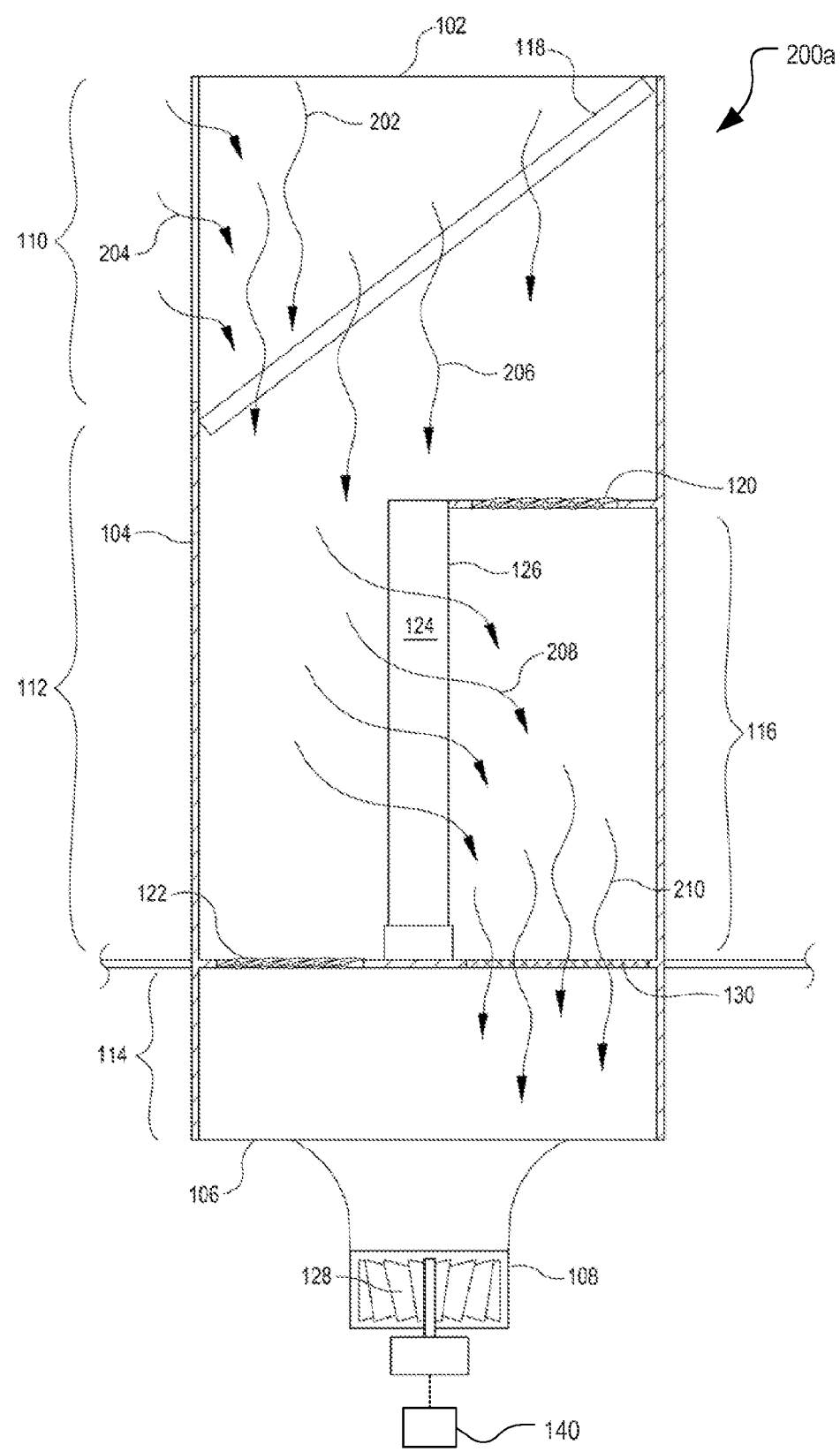
FIG. 2 is a side view schematic illustrating a first example airflow configuration for cooling an airflow with the cooling unit of FIG. 1, in accordance with embodiments.

FIG. 2 is a side view schematic illustrating a first example airflow configuration 200a (or a high cooling configuration) for cooling an airflow with the cooling apparatus of FIG. 1, in accordance with embodiments. In the first example airflow configuration 200a, both dampers 120 and 122 are closed. Air flows into the inlet section 110 at a top inlet 102 (202) and/or at a side inlet to the inlet section (204). The airflow crosses the inlet filter 118 (206) and enters the intermediate section 112. The airflow in the intermediate section does not cross the lower damper 122 or the upper damper 120, therefore most or all of the airflow is forced to cross the divider 126 via the heat exchanger 124 therein (208). The airflow then enters the elongate chamber 116 and exits the chamber via the chamber outlet 130.

In embodiments where the heat exchanger 124 includes an evaporative element, the airflow (208) into the elongate chamber 116 may contain a higher portion of water vapor or even entrained water droplets or microdroplets. The entrained water vapor may be partially captured by a filter arranged in the chamber outlet 130; and any water droplets or microdroplets may be caught or mitigated by a filter or by any suitable mesh, grill, screen or other comparable material. One or more desiccating elements may also be present in the outlet section 114.

The airflow out of the elongate chamber 116 and into the outlet chamber 114 (210) can proceed through the outlet 108 in the end wall 106 of the apparatus, where it may pass through a fan element 128, which in some cases may be a downward-pointed plenum fan, prior to passing by the sensor. The fan element 128 may be static or active, depending on a desired airflow rate and/or pressure which can be determined, for example, at the sensor 140. For example, if a pressure downstream of the apparatus as determined by the sensor 140 is below a threshold, then the fan element 128 may be turned on or sped up to increase a flow rate through the apparatus and increase a downstream pressure. Likewise the fan element 128 may be turned off or slowed if a downstream pressure or flow rate is higher than desired.

Figure 3:
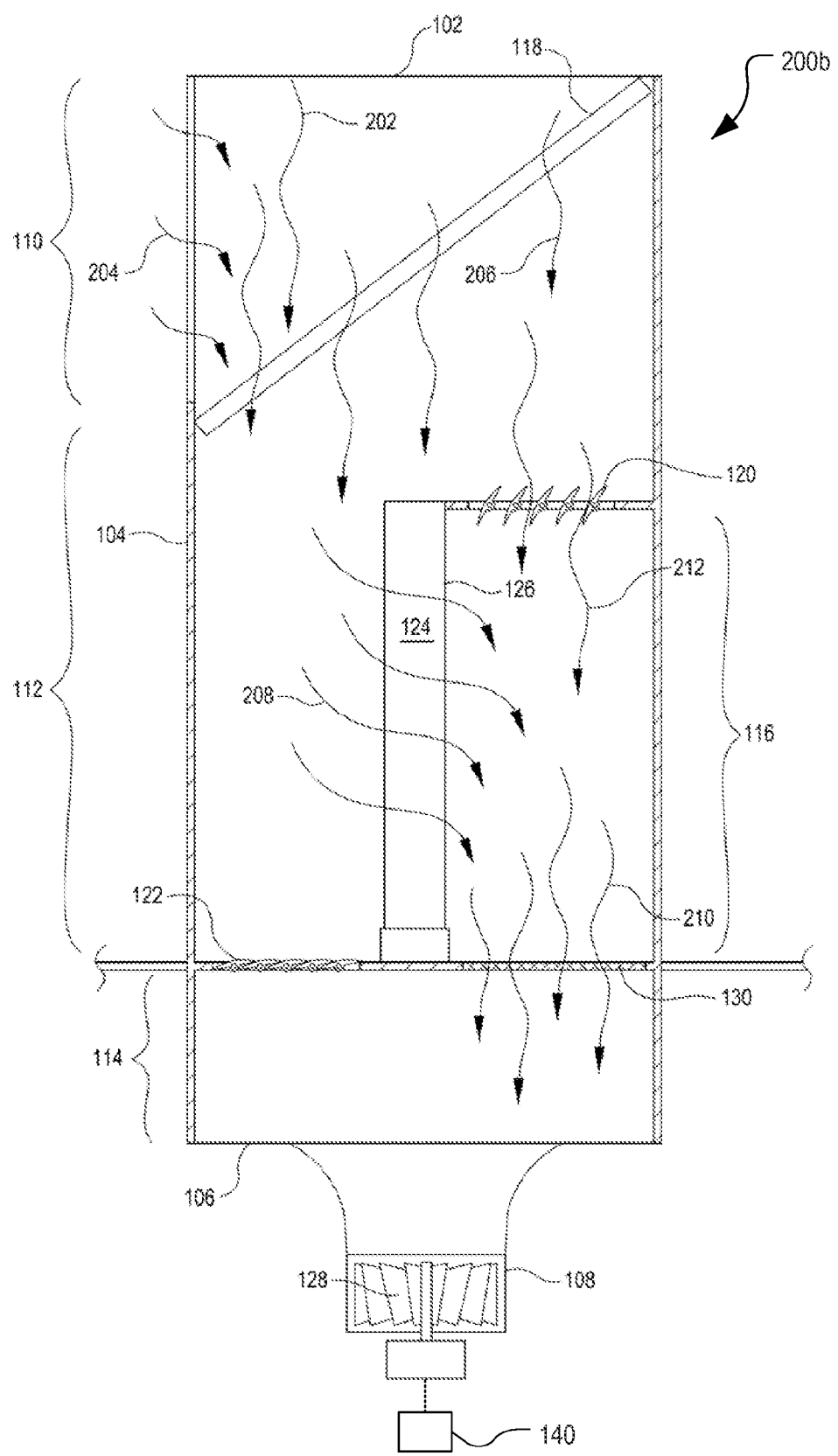
FIG. 3 is a side view schematic illustrating a second example airflow configuration for cooling an airflow with the cooling unit of FIG. 1, in accordance with embodiments.

FIG. 3 is a side view schematic illustrating a second example airflow configuration (or an intermediate cooling configuration) 200b for cooling an airflow with the cooling apparatus of FIG. 1, in accordance with embodiments. In the second example airflow configuration 200b, lower damper 122 is closed and upper damper 120 is open. Upper damper 120 can be opened by various degrees from fully closed to fully open in order to throttle a bypass flow of air through the upper damper 120.

As described above in reference to FIG. 2, air can flow into the inlet section 110 at a top inlet 102 (202) and/or at a side inlet to the inlet section (204). The airflow crosses the inlet filter 118 (206) and enters the intermediate section 112. The airflow in the intermediate section cannot cross the lower damper 122, but can cross the upper damper 120 (212), as well as the divider 126 via the heat exchanger 124 therein (208). The airflow then enters the elongate chamber 116 and exits the chamber via the chamber outlet 130. The flow out from the elongate chamber 116 (210) is a mixture of cooler air that crossed over the heat exchanger 124 (208) and air that bypassed the exchanger (212). The temperature of this mixed airflow (210) can be adjusted by adjusting a flow rate across the upper damper 120 by partially closing or opening the damper 120. Also, a relative moisture content of the mixed airflow (210) can be adjusted by partially closing or opening the upper damper 120. For example, if the sensor 140 downstream detects that a moisture content is above a threshold, the upper damper 120 can be opened to cause the moisture content to decrease. In some cases, opening the upper damper 120 can also reduce a pressure drop across the apparatus by opening additional paths for the airflow within the intermediate section 112.

In embodiments having a mixture of airflow portions that have crossed the heat exchanger 124 (208) and crossed through one or both of the dampers 120, 122 (such as 212), the fan element 128 in the outlet 108 can also be used to cause mixing of the airflow portions in order to homogenize the temperature of the stream of air at the outlet. The fan element 128 can be controlled in part by receiving instructions based on data collected at the downstream sensor 140. In some cases, the downstream sensor 140 can be located a distance from the outlet 108 on the order of several feet. In some cases, the downstream sensor 140 can be located from 1 foot to 5 feet downstream of the outlet 108. In some other cases, the downstream sensor 140 may be substantially replaced by one or more sensors located in an electronic device, such as a temperature sensor, humidity sensor, pressure sensor, airspeed sensor, or any other suitable sensor. In some cases, the sensor 140 may detect the homogeneity of the temperature and/or humidity of the output airflow, such that an active state or a speed of the fan element 128 can be controlled in response to variance in any of the above parameters rather than, or in addition to, one or more of said parameters exceeding a preset value.

In some alternative embodiments, the lower damper 122 can be opened instead of or in addition to the upper damper 120, such that a portions of the airflow pass therethrough as well as through the upper damper 120 (212) and the heat exchanger 124 (208).

Figure 4:
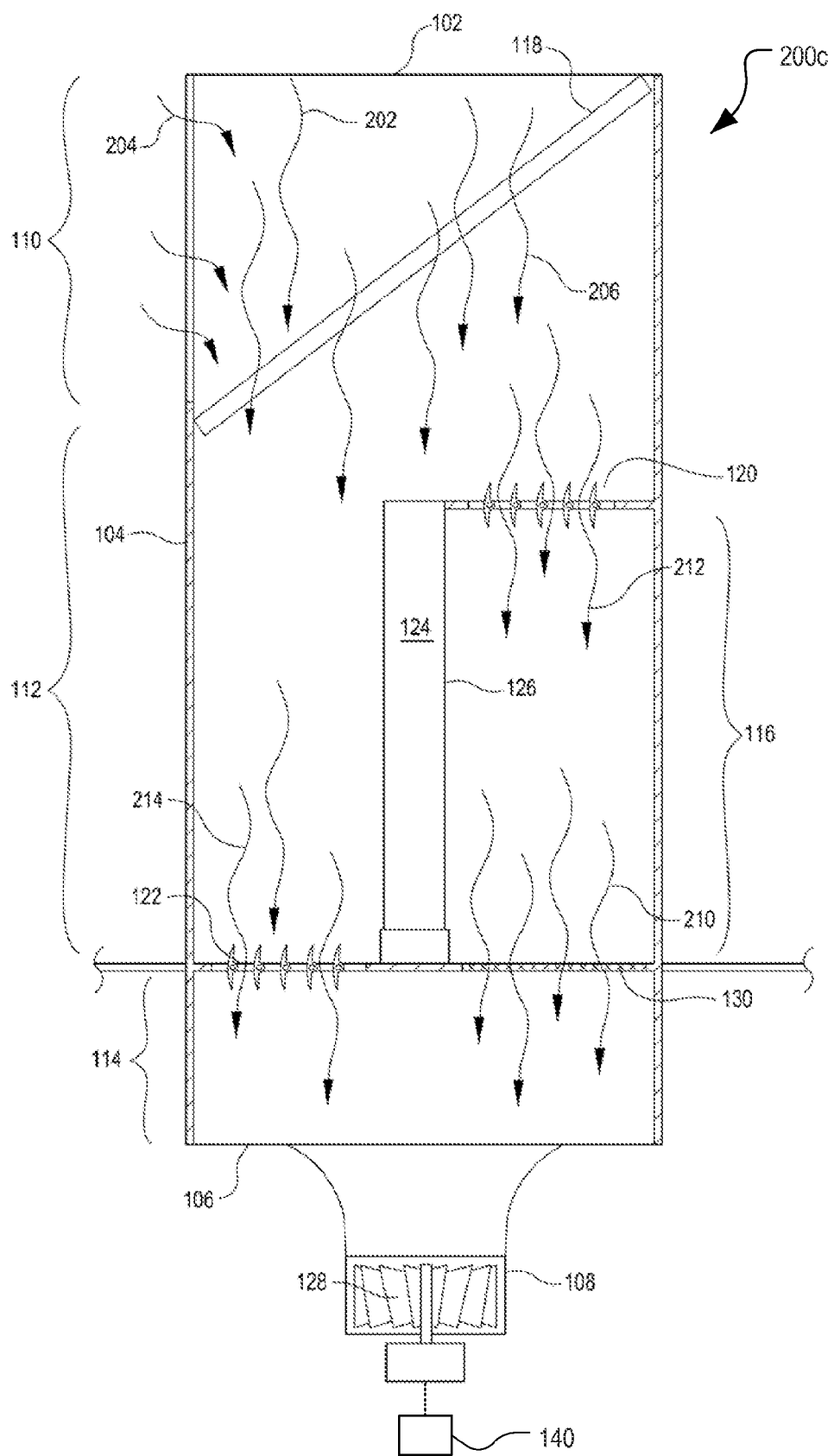
FIG. 4 is a side view schematic illustrating a third example airflow configuration for cooling an airflow with the cooling unit of FIG. 1, in accordance with embodiments.

FIG. 4 is a side view schematic illustrating a third example airflow configuration 200c (or a bypass configuration) for passing an airflow through the cooling apparatus of FIG. 1, in accordance with embodiments. In this third example airflow configuration 200c, lower damper 122 is open and upper damper 120 is open.

As described above in reference to FIGS. 2 and 3, air can flow into the inlet section 110 at a top inlet 102 (202) and/or at a side inlet to the inlet section (204). The airflow crosses the inlet filter 118 (206) and enters the intermediate section 112. The airflow in the intermediate section can cross both of the lower damper 122 (214) and the upper damper 120 (212). When both dampers are similarly open, the apparatus does not generate a significant pressure difference across the divider 126, so that little or no air will flow across heat exchanger 124 therein. The airflow through the lower damper 122 (214) combines with the airflow through the upper damper 120 (212), within the outlet section 114, at which point the airflow exits the apparatus through the outlet 108 and past the fan element 128. The fan element can be used in a manner as described above with reference to FIG. 2. One effect of this third airflow configuration 200c is a reduced pressure drop across the apparatus, which can result in a higher total flow rate. The air at the outlet 108 may be cooler than the air at the inlet 102 due to a portion of the airflow running along and abutting the heat exchanger. The airflow configuration 200c is especially useful for transferring a low-temperature outside airflow into a computer room without unnecessary further expenditure of energy to further cool the flow of low-temperature outside air.

Figure 5:
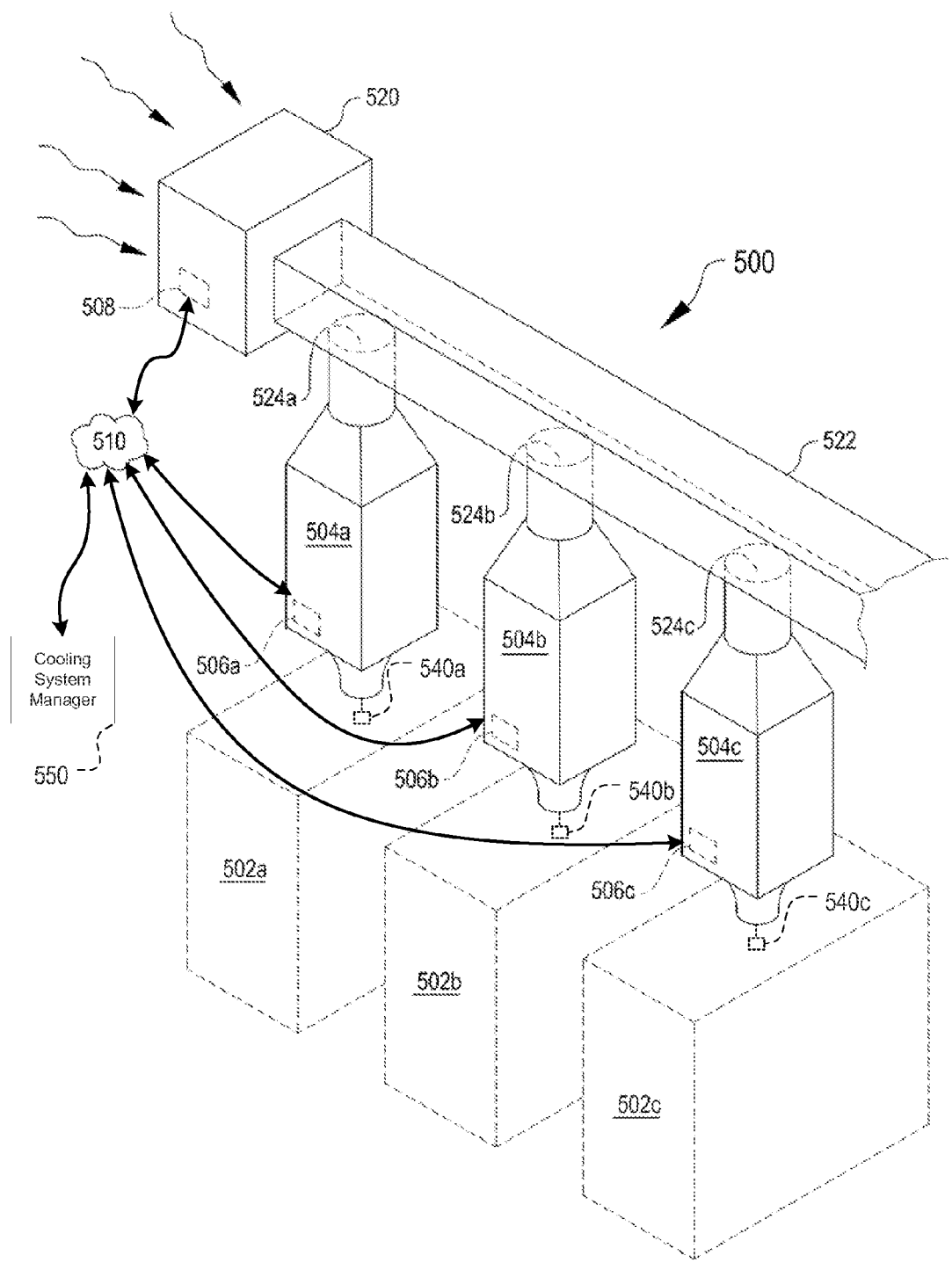
FIG. 5 is a perspective view of a system for cooling a plurality of airflows with a plurality of cooling unit as shown in FIG. 1, in accordance with embodiments.

FIG. 5 is a perspective view of a system 500 for cooling a plurality of airflows with a plurality of cooling apparatuses 504a, 504b, 504c (collectively 504) which embody aspects of the cooling apparatus shown in FIG. 1, in accordance with embodiments. Each of the cooling apparatuses 504 can be caused to assume a "high cooling configuration" as illustrated in FIG. 2, an "intermediate cooling configuration" as illustrated in FIG. 3, and a "bypass configuration" as illustrated in FIG. 4.

The system 500 includes an airflow source 520 which can be a conventional HVAC device for taking in air from an ambient environment, such as an exterior of a building, or any other suitable air intake unit. The airflow source 520 creates a flow and pressure within a primary duct 522, which distributes the airflow to other components in the system 500. Each of the cooling apparatuses 504 possesses an intake 524a, 524b, 524c (collectively 524) which connects the flow of air from the airflow source 520 to the cooling apparatuses 504. Each cooling apparatus outputs a portion of the airflow to an electronic device enclosure 502a, 502b, 502c which can be, for example, a computer cabinet, server rack, room, or any other suitable fully or partially enclosed space.

Each of the cooling apparatuses 504 can be controlled by a control feature 506a, 506b, 506c for actuating dampers therein (such as lower damper 122 and upper damper 120 shown in FIGS. 1-4) and thereby causing each of the apparatuses 504 to assume one of the high, intermediate, or bypass configurations. The control features 506 can include sensors for any or all of: temperature, pressure, airflow speed, flow rate, and/or humidity. In some cases, the control features 506 can communicate with a downstream sensor 540a, 540b, 540c, or can receive information from one or more sensors in electronic components (not shown) within the electronic device enclosures 502.

In some cases, control features 506 can communicate via a network 510 with a cooling system manager 550. In some other cases, the cooling system manager 550 can also receive data from the sensors 540 and/or from other sensors in the electronic device enclosures 502 such as onboard sensors in one or more electronic components therein. The cooling system manager 550 can be a computer system associated with the system 500, can be distributed among the control features 506, or can be a cloud computing service in communication with the control features 506 via the network 510. The cooling system manager 550 can, responsive to sensor information, determine whether a temperature, pressure, flow rate, and/or humidity in one or more of the electronic component enclosures 502 falls outside a preferred range. In one example, suppose that the temperature in an enclosure such as component enclosure 502a is higher than a maximum acceptable temperature. The cooling system manager can detect, via the sensor 540a, the temperature within a portion of the component enclosure 502a and instruct the cooling apparatus 504a, via the control feature 506a, to assume the high cooling configuration. In a second example, suppose that the temperature in an enclosure 502a falls below a preferred range due to prolonged cooling, low load on the electronic components therein, or other comparable circumstance. The cooling system manager 550 can detect, via the sensors 540a, that the temperature is below a preferred range and can instruct the control feature 506a to cause the cooling apparatus 504a to: change from the high cooling configuration to an intermediate configuration; change from an intermediate cooling configuration to a less-throttled intermediate cooling configuration; or change from an intermediate cooling configuration to a bypass configuration. The system 500 can also communicate with the airflow source 520, and may cause the airflow source 520 to adjust a flow rate and/or pressure in order to accommodate a change in the collective pressure drop across the cooling apparatuses 504 caused by, for example, initiating a high cooling configuration in multiple cooling apparatuses simultaneously.

Figure 6:
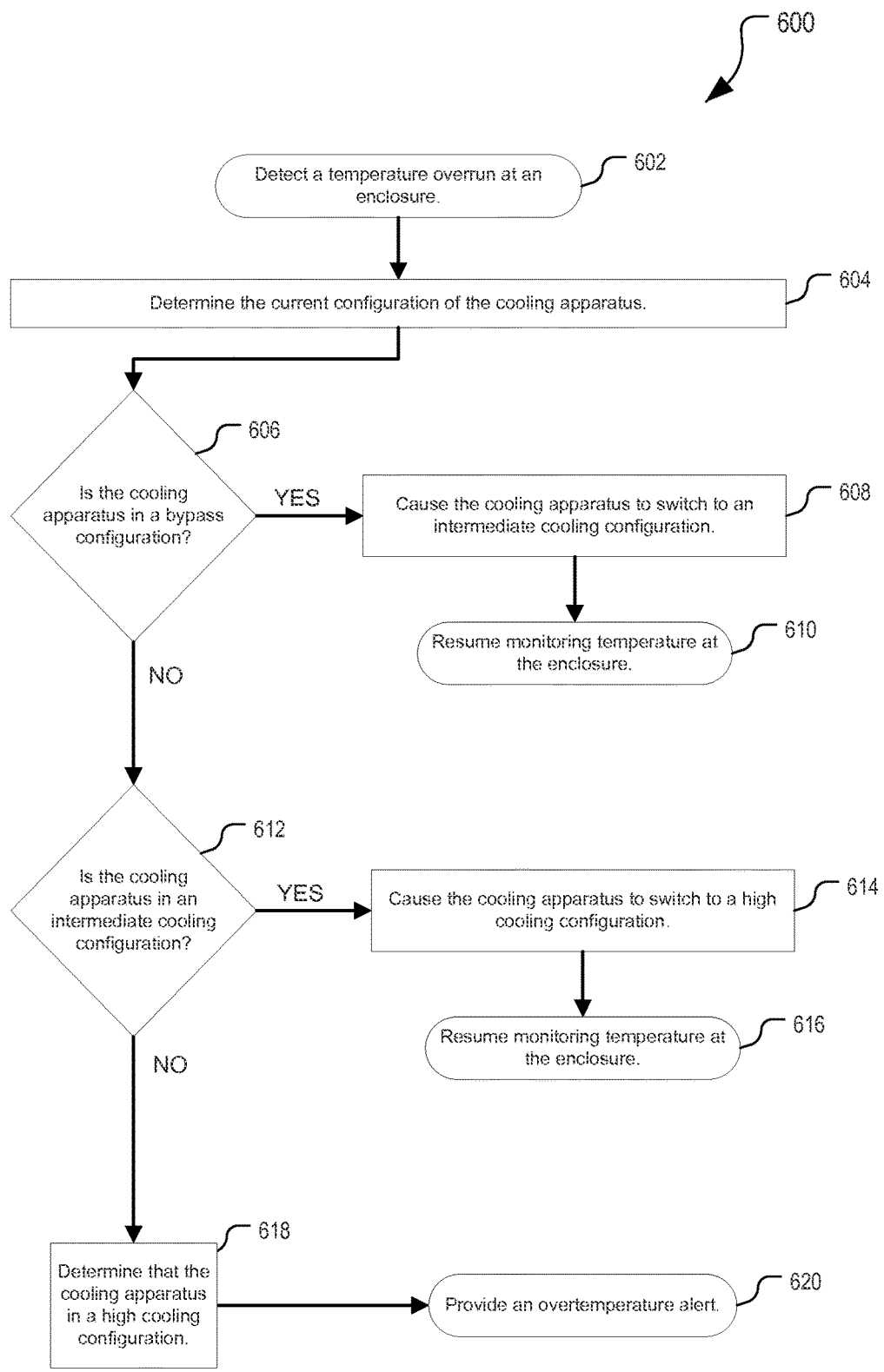
FIG. 6 is an example process for controlling a configuration of the cooling unit shown in FIG. 1, in accordance with embodiments.

FIG. 6 is an example process 600 for controlling a configuration of the cooling apparatus shown in FIG. 1. In the process 600, one or more sensors in an electronic component enclosure and/or at an outlet of a cooling apparatus detects a temperature, and a control feature detects that the temperature is above a predetermined range (602). The system determines the current configuration of the cooling apparatus, which may be a high cooling configuration, bypass configuration, intermediate cooling configuration, or a subset of various intermediate cooling configurations (604). If the cooling apparatus is in a bypass configuration (606) (see FIG. 4), the system can cause the cooling apparatus to transition to an intermediate cooling configuration (608) (see FIG. 3). Then the system can pause to permit a temperature change to take effect in the electronic component enclosure and resume monitoring the temperature (610).

If the cooling apparatus is not in a bypass configuration, the system determines whether the cooling apparatus is in an intermediate cooling configuration (612). If so, the system can cause the cooling apparatus to transition from the intermediate cooling configuration to a high cooling configuration (614) (see FIG. 2). Then the system can pause to permit a temperature change to take effect in the electronic component enclosure and resume monitoring the temperature (616).

If the cooling apparatus is not in an intermediate configuration, the system determines that the cooling apparatus is already in a high cooling configuration (618), and the system can provide an over temperature alert (620) or other suitable contingency measure. For example, in some cases, the system can provide instructions to an airflow source, such as the airflow source 520 (FIG. 5) to increase a flow rate of an input airflow.

Figure 7:
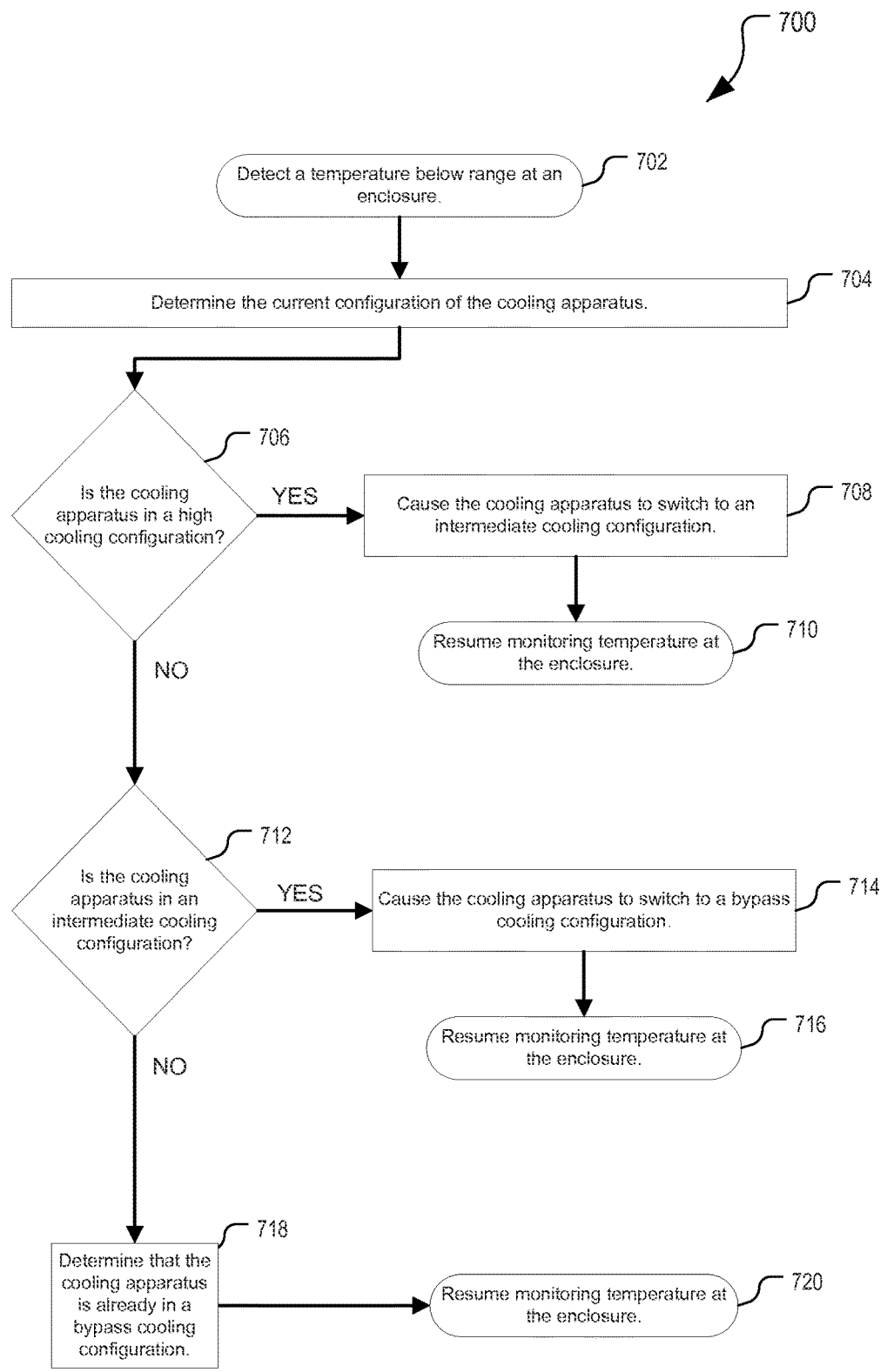
FIG. 7 is an example process for controlling a configuration of the cooling unit shown in FIG. 1, in accordance with embodiments.

FIG. 7 is a second example process 700 for controlling a configuration of the cooling apparatus shown in FIG. 1. In the process 700, one or more sensors in an electronic component enclosure and/or at an outlet of a cooling apparatus detects a temperature, and a control feature detects that the temperature is below a predetermined range (702). The system determines the current configuration of the cooling apparatus, which may be a high cooling configuration, bypass configuration, intermediate cooling configuration, or a subset of various intermediate cooling configurations (704). If the cooling apparatus is in a high cooling configuration (706) (see FIG. 2), the system can cause the cooling apparatus to transition to an intermediate cooling configuration (708) (see FIG. 3). Then the system can pause to permit a temperature change to take effect in the electronic component enclosure and resume monitoring the temperature (710).

If the cooling apparatus is not in a high cooling configuration, the system determines whether the cooling apparatus is in an intermediate cooling configuration (712). If so, the system can cause the cooling apparatus to transition from the intermediate cooling configuration to a bypass configuration (714) (see FIG. 4). Then the system can pause to permit a temperature change to take effect in the electronic component enclosure and resume monitoring the temperature (716).

If the cooling apparatus is not in an intermediate configuration, the system determines that the cooling apparatus is already in a bypass configuration (618), and the system can resume monitoring the temperature (620). In some cases, the system can provide instructions to an airflow source, such as the airflow source 520 (FIG. 5) to decrease a flow rate of an input airflow so as to conserve power.

Figure 8:
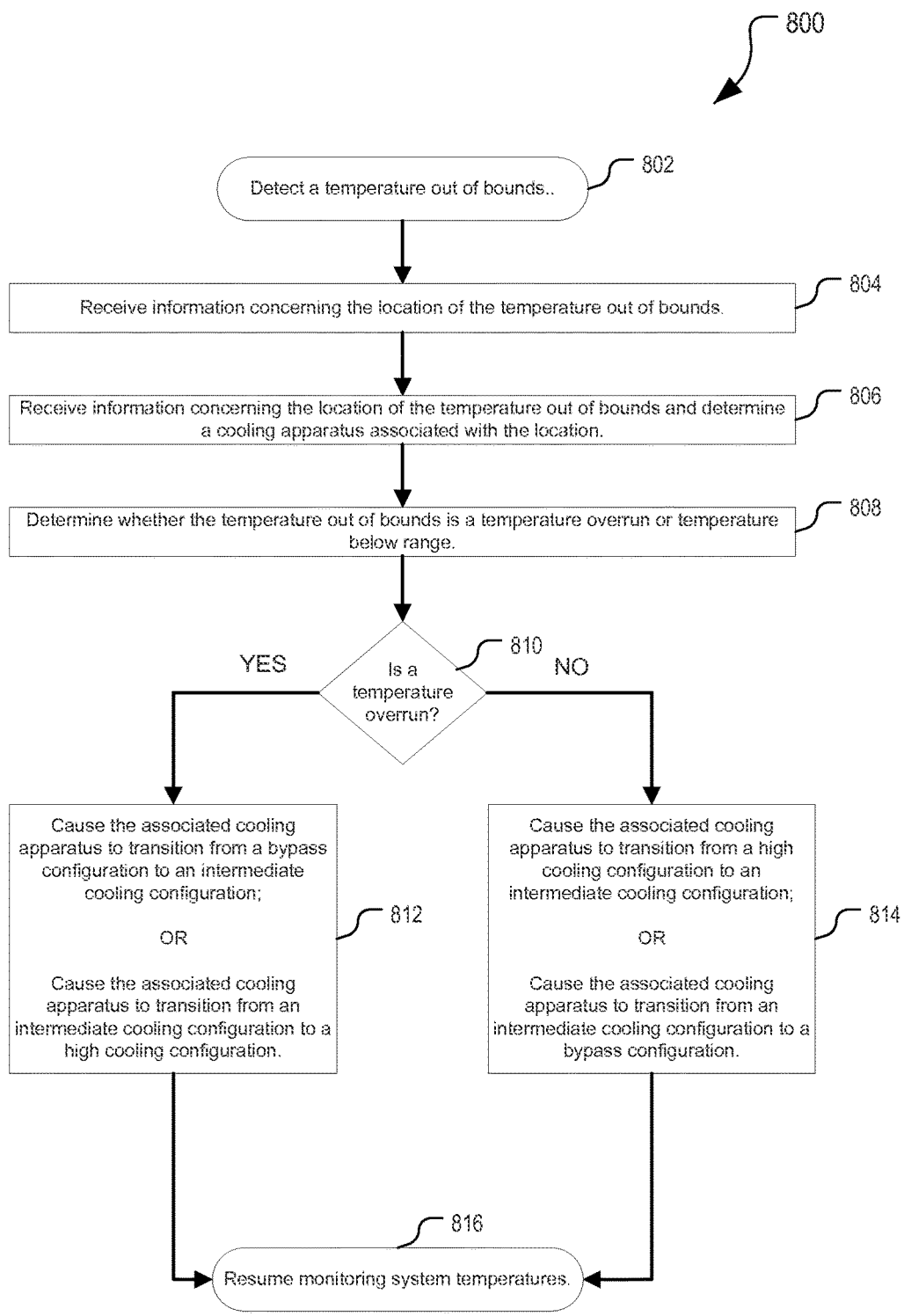
FIG. 8 is an example process for controlling configurations of one or more cooling units in the system of FIG. 5, in accordance with embodiments.

FIG. 8 is an example process 800 for controlling configurations of one or more cooling apparatuses in the system of FIG. 5. In the process 800, one or more sensors in one or more electronic component enclosures and/or in the outlet of one or more cooling apparatuses detect a temperature out of bounds (802). In some cases, the temperature out of bounds may indicate that a temperature is too high (an overrun); and in some other cases the temperature out of bounds may indicate that the temperature is low. The system receives information concerning the location of the temperature out of bounds (804), which can refer to a computer cabinet (which may, in some cases, be fed by multiple cooling apparatuses), or to a particular cooling apparatus; and the system determines the cooling apparatus configured to address the temperature out of bounds (806). Next, the system can determine whether the temperature out of bounds is a temperature overrun or a temperature below a range (808).

If the temperature out of bounds is a temperature overrun (at 810), then the system can implement a process, such as the process 600 (FIG. 6) for addressing a temperature overrun. In some cases, the system may cause the associated cooling apparatus to change in state (812), e.g. to change from a bypass configuration to an intermediate cooling configuration (in which a part of the airflow passes through an evaporative cooler and another part of the airflow bypasses the evaporative cooler). Alternative, if the system is already in an intermediate cooling configuration, the system 800 may cause the cooling apparatus to change from an intermediate cooling configuration to a high cooling configuration.

After a new configuration has been set, the system can resume monitoring the system temperatures. In some alternative embodiments, a cooling apparatus can have multiple intermediate cooling configurations having different degrees of closure of the dampers (such as the dampers 120 and 122 shown in FIG. 1). Where multiple intermediate cooling configurations are present, the system may step from a configuration with relatively high bypass, to a configuration with less bypass, and so on until a level of cooling is attained which provides for a temperature consistently within an allowable range.

If the temperature out of bounds is not an overrun (at 810), then the system can cause the cooling apparatus to transition from a high cooling configuration to an intermediate cooling configuration (814), or to transition from an intermediate cooling configuration to a bypass configuration. The system can then proceed to resume monitoring the system temperatures 816. In some cases, the system can cause an air flow source to adjust a flow rate and pressure in response to a signal from the sensors, as described above.

Some or all of the processes 600, 700, and 800 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Figure 9:
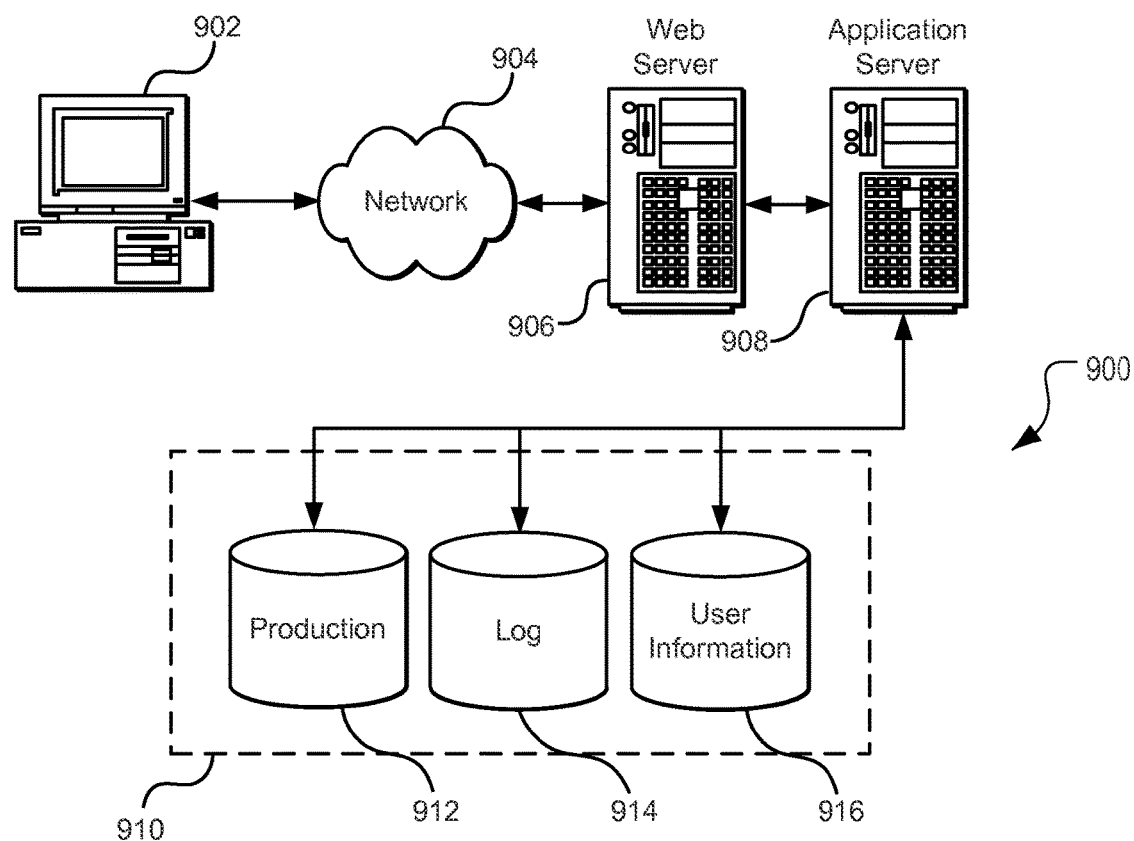
FIG. 9 illustrates an environment in which various embodiments can be implemented.

FIG. 9 illustrates aspects of an example environment 900 for implementing aspects in accordance with various embodiments. As will be appreciated, although a Web-based environment is used for purposes of explanation, different environments may be used, as appropriate, to implement various embodiments. The environment includes an electronic client device 902, which can include any appropriate device operable to send and receive requests, messages, or information over an appropriate network 904 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 906 for receiving requests and serving content in response thereto, although for other networks an alternative device serving a similar purpose could be used as would be apparent to one of ordinary skill in the art.

The illustrative environment includes at least one application server 908 and a data store 910. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 902 and the application server 908, can be handled by the Web server. It should be understood that the Web and application servers are not required and are merely example components, as structured code discussed herein can be executed on any appropriate device or host machine as discussed elsewhere herein.

The data store 910 can include several separate data tables, databases or other data storage mechanisms and media for storing data relating to a particular aspect. For example, the data store illustrated includes mechanisms for storing production data 912 and user information 916, which can be used to serve content for the production side. The data store also is shown to include a mechanism for storing log data 914, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 910. The data store 910 is operable, through logic associated therewith, to receive instructions from the application server 908 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 902. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 9. Thus, the depiction of the system 900 in FIG. 9 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A cooling apparatus for an electronic component enclosure, comprising:
   a duct element having an inlet, an outlet, and an intermediate portion arranged between the inlet and outlet, the inlet being configured to receive a flow of air; and
   an airflow control assembly arranged in the intermediate portion for controlling the flow of air through the duct element, the airflow control assembly comprising:
      a first controllable damper assembly arranged between the intermediate portion and the outlet and configured to fluidly connect and disconnect the intermediate portion with the outlet;
      a second controllable damper assembly arranged between the intermediate portion and an elongate chamber, where the elongate chamber is in fluid connection with the outlet, the second damper assembly being configured to fluidly connect and disconnect the intermediate portion with the elongate chamber; and
      an exchanger assembly arranged between the intermediate portion and the elongate chamber, the exchanger assembly being configured to fluidly connect the intermediate portion with the elongate chamber and to absorb heat.

2. The apparatus of claim 1, wherein the exchanger assembly comprises an evaporative cooler having a porous element configured to be fluidly connected with an evaporable liquid source.

3. The apparatus of claim 2, comprising a fan element configured to mix the flow of air at the outlet.

4. The apparatus of claim 1, further comprising a filter to filter the flow of air, the filter being arranged in the duct element at a position that is upstream from the airflow control assembly relative to a direction of the flow of air.

5. The apparatus of claim 4, wherein the filter further comprises a removable filter, and wherein the duct element further comprises an exterior opening configured for removing the filter.

6. A cooling apparatus comprising:
   a duct element having an inlet, an outlet, and an intermediate portion between the inlet and the outlet; and
   an airflow control assembly arranged in the intermediate portion of the duct element, the airflow control assembly comprising:
      a first damper fluidly connecting the intermediate portion with the outlet; and
      a heat exchanger assembly fluidly connecting the intermediate portion with the outlet through a heat exchanger;
      an airflow source configured to supply a flow of air to the inlet of the duct element; and
      a control element configured to actuate the first damper in order to manipulate a subset of the flow of air that flows through the heat exchanger.

7. The apparatus of claim 6, wherein the intermediate portion of the cooling apparatus further comprises:
   a primary chamber, and
   a secondary chamber, the secondary chamber being fluidly connected with the primary chamber by the heat exchanger assembly and by a second damper, and being fluidly connected with the outlet; and wherein the control element is further configured to actuate the second damper in order to further manipulate a flow rate of the subset of the flow of air that flows through the heat exchanger.

8. The apparatus of claim 7, wherein:
   the first damper is configurable into a closed configuration; and
   the second damper is configurable into a closed configuration, such that the subset of the flow of air that flows through the exchanger comprises substantially all of the flow of air.

9. The apparatus of claim 7, wherein:
   the first damper is configurable into an open configuration; and
   the second damper is configurable into an open configuration, such that the flow of air substantially bypasses the heat exchanger and the subset of the flow of air through the heat exchanger comprises a minimal part of the flow of air.

10. The apparatus of claim 7, wherein:
    the first damper is configurable into a closed configuration; and
    the second damper is configurable into a partially open configuration, such that the subset of the flow of air that flows through the exchanger comprises a portion of the flow of air.

11. The apparatus of claim 10, wherein the system is configured to:
    receive instructions to increase a cooling efficiency; and
    responsive to receiving instructions to increase a cooling efficiency, cause the second damper to incrementally close, such that the subset of the flow of air that flows through the exchanger increases.

12. The apparatus of claim 6, wherein the cooling unit further comprises a fan arranged at the outlet of the cooling unit; and wherein the control element is further configured to cause the fan to mix the flow of air at the outlet.

13. The apparatus of claim 6, wherein the cooling unit further comprises a fan arranged at the outlet of the cooling unit; and wherein the control element is further configured to:
    receive instructions to increase a flow rate of the flow of air, and
    control the plenum fan to increase the flow rate of the flow of air.

14. The apparatus of claim 6, further comprising a filter to filter the flow of air, the filter being arranged in the duct element at a position that is upstream from the airflow control assembly relative to a direction of the flow of air.

15. The apparatus of claim 14, wherein the filter further comprises a removable filter and wherein the duct element further comprises an exterior opening configured for removing the filter.

16. A system for cooling a plurality of enclosures, the system comprising:
    an air flow source configured to provide a flow of air;
    a plurality of cooling units, each of the plurality of cooling units being fluidly connected with the air flow source and with a respective one of a plurality of enclosures; and each of the plurality of cooling units comprising:
       a duct element having an inlet, an outlet, and an intermediate portion comprising a primary chamber and a secondary chamber arranged between the inlet and outlet; and
       an airflow control assembly arranged in the intermediate portion of the duct element for controlling the flow of air through the duct element, the airflow control assembly comprising:

a first damper fluidly connecting the intermediate portion with the outlet;

a second damper fluidly connecting the primary chamber and the secondary chamber; and an exchanger assembly arranged between the primary chamber and the secondary chamber, the exchanger assembly being configured to fluidly connect the primary chamber with the secondary chamber and to absorb heat; and a control system comprising:

one or more processors; and memory including instructions that, when executed with the one or more processors, cause the system to control the plurality of cooling units by:

actuating the first damper to control a first portion of the flow of air through the first damper of each respective one of the plurality of cooling units; and actuating the second damper to control a second portion of the flow of air through the second damper of each respective one of the plurality of cooling units.

17. The system of claim 16, wherein the memory further includes instructions to cause the system to:

detect a temperature at an enclosure of the plurality of enclosures;

determine that a temperature overrun has occurred by comparing the temperature to a predetermined limit;

identify a cooling unit associated with the enclosure;

cause the first damper of the identified cooling unit to assume a closed position; and cause the second damper of the identified cooling unit to assume a closed position.

18. The system of claim 16, wherein the memory further includes instructions to cause the system to:

detect a temperature at an enclosure of the plurality of enclosures;

determine that the temperature is below an optimal range by comparing the temperature to a predetermined range;

identify a cooling unit associated with the enclosure;

cause the first damper of the identified cooling unit to assume an open position; and cause the second damper of the identified cooling unit to assume an open position.

19. The system of claim 18, wherein the memory further includes instructions to cause the system to cause the airflow source to increase a flow rate of the flow of air.

20. The system of claim 16, wherein each of the plurality of cooling units comprises a filter arranged in the respective duct element at a position that is upstream from the respective airflow control assembly.

* * * * *